United States Patent [19]
Brown et al.

[11] Patent Number: 5,365,103
[45] Date of Patent: Nov. 15, 1994

[54] PUNCHTHRU ESD DEVICE ALONG CENTERLINE OF POWER PAD

[75] Inventors: Charles A. Brown, Corvallis, Oreg.; Robert B. Manley, Fort Collins, Colo.

[73] Assignee: Hewlett-Packard Company, Palo Alto, Calif.

[21] Appl. No.: 23,266

[22] Filed: Feb. 25, 1993

[51] Int. Cl.⁵ .................. H01L 29/06; H01L 29/44
[52] U.S. Cl. .................................. 257/497; 257/362; 257/786; 257/758
[58] Field of Search .............. 257/173, 362, 497, 498, 257/50, 530, 665, 786, 784, 760, 361, 758

[56] References Cited
U.S. PATENT DOCUMENTS

| | | | |
|---|---|---|---|
| 4,499,557 | 2/1985 | Holmberg et al. | 257/754 |
| 4,994,874 | 2/1991 | Shimizu et al. | 257/362 |
| 5,291,051 | 3/1994 | Hoang et al. | 257/361 |

Primary Examiner—Robert Limanek
Assistant Examiner—David B. Hardy

[57] ABSTRACT

Multiple punchthru devices are coupled between multiple metal-two conductors and a metal-one bond pad. Each punchthru device has the capacity to couple its respective metal-two conductor to the bond pad when a predetermined voltage potential exists between the metal-two conductor and the bond pad. A set of metal-one islands, one set associated with each metal-one bond pad cell, resides in a bond pad channel. The positioning of the punchthru devices and the islands minimizing the bond pad cell size and minimizing the spacing between adjacent bond pad cells. The bond pad cell configuration also allows any metal-two conductor to be coupled to the bond pad without having to rearrange punchthru devices or reconfigure the bond pad cell. The multiple punchthru devices associated with each bond pad cell provide redundant overvoltage protection superior to present overvoltage protection circuits.

18 Claims, 4 Drawing Sheets

PUNCHTHRU ESD DEVICE ALONG CENTERLINE OF POWER PAD

BACKGROUND OF THE INVENTION

This invention relates generally to voltage protection circuitry for integrated circuits and more particularly to a novel punchthru device configuration for redirecting damaging high voltages from integrated circuits.

Integrated circuits (ICs) are damaged when a high voltage electrostatic discharge (ESD) enters the circuit through external pins. For example, a person can build up and carry an electrostatic charge of 10,000 volts. If the person then handles the IC, the built-up electrostatic energy can be discharged into the IC through one of its external pins. The sudden transfer of high-voltage energy either damages the active and passive devices within the IC or the fine conductors or insulators that interconnect these devices. In either case, the IC is damaged and must be replaced.

Similar IC damage can occur from voltage spikes and current surges that come from signal lines coupled to the external IC I/O pins. For example, the IC power and ground pins are coupled through internal conductors to the active and passive devices of the IC. The external power and ground pins are then attached to power supplies and ground terminals, respectively.

To prevent damage from ESD, either a punchthru device or a diode is placed between the power supply bond pads and ground. For example, a typical punchthru device comprises a gateless field effect transistor that conducts current whenever its drain-to-source voltage rises above a predetermined voltage level. The drain of the punchthru device is coupled to an internal bond pad within the IC. The source of the punchthru device is coupled to ground. Thus, excessive voltage placed on an external IC pin causes the punchthru to conduct, shorting the pin to ground. This directs the high voltage or current from the sensitive internal components of the IC to ground.

To utilize this type of ESD protection, a ground ring is placed around the periphery of the IC die. The bond pads are placed inside the ground ring and connected to one of the internal power, ground, or data signal conductors. Punchthru devices are then coupled between each bond pad and the external ground ring.

The problem with this approach is that the punchthru device is at the periphery of the bond pad block. The bond pad block (i.e.,cell) comprises a bonding pad attached to a conductor. The bond pad cell is then defined by the bond pad and conductor circuitry described above and a predefined area surrounding this circuitry. The bonding pad receives a bonding wire that is coupled through the bond pad cell conductor to an internal conductor within the IC. To avoid latchup and signal interference from cross-talk, design rules require that bond-pad cells be spaced a minimum distance apart. These rules also require that guard rings be placed around each cell. However, the orientation and location of the punchthru device determines how close adjacent bond pad cell can be placed next to each other. For example, a punchthru device located on the outer perimeter of the area defining the cell, increases the distance that adjacent bond pad cells must be separated from each other.

In addition, only limited ESD protection is provided when a single punchthru is coupled between the external IC pins and ground. For example, various power and ground conductors exist within the IC. These conductors are not always coupled by an overvoltage protection device to ground. Thus, overvoltage conditions on these conductors will damage the IC. If only a single punchthru device is used, and the ground pin is inadvertently disconnected, the IC is left unprotected against over-voltage conditions. Alternatively, when excessive current passes to the bond pad, a single punchthru device may not be capable of carrying the entire charge.

Therefore, more effective over-voltage protection would be possible if redundant punchthru devices were placed between a bond pad and multiple power and ground conductors within the IC. This approach, however, requires additional punchthru devices. More punchthru devices not only increase the minimum distance requirements between cells, but also increase the amount of space required for each cell. Larger cells, and greater distances between cells, increase the size of the IC die and reduce the number of pins that can be placed around the outside of the IC. In addition, multiple punchthru devices would require different masks for each bond pad cell. This would increase the time and cost of designing the IC.

Accordingly, a need remains for a generic bond pad cell that can use multiple punchthru devices to provide redundant overvoltage protection.

SUMMARY OF THE INVENTION

It is, therefore, an object of the invention to improve the overvoltage protection for integrated circuits with multiple punchthru devices.

Another object of the invention is to facilitate the miniaturization of integrated circuits by reducing the amount of space used in providing redundant overvoltage protection.

A further object of the invention is to reduce the time and cost of designing integrated circuits by using a generic bond pad cell configuration to provide overvoltage protection for multiple input/output signals.

The invention is a bond pad cell comprising first and second metal levels (i.e., metal-one and metal-two, respectively). Internal conductors within the IC are formed in the second metal level (i.e., metal-two) and couple various power, ground and data signals to active and passive devices within the integrated circuit. The bond pad cell is, typically, elongated in a dimension substantially perpendicular with the outer edge of the integrated circuit die and contains one or more islands coupled to the various metal-two conductors. Multiple punchthru devices are coupled between the metal-two conductors and the metal-one bond pad. Each punchthru device couples its respective metal-two conductor to the bond pad when a predetermined voltage potential exists between the metal-two conductor and the bond pad.

In a first embodiment of the invention, each bond pad cell has a bonding region (bond pad) for attaching a bond wire and first and second parallel legs separated by a channel. The first and second legs are substantially perpendicular to the outer edge of the integrated circuit die. The distance between outer edges of the first and second legs of each bond pad cell is approximately equal to the width of the associated bonding region. This minimizes the bond pad cell area and allows adjacent cells to be placed closer together.

Back-to-back punchthru devices can be used to increase additional by-pass capacity. One punchthru device is positioned under each metal-two conductor to provide redundant overvoltage protection. In the back-to-back configuration, each punchthru device comprises a substrate having first, second, and third N+ doping regions. The first and second doping regions operate as first and second drain regions for the punchthru device and the third doping region operates as a common source region associated with the first and second drain regions. The first and second doping regions are located directly below the first and second legs of the bond pad cell, respectively, and the third doping region is located directly below one of the metal-one islands. Accordingly, the first and second regions are contacted to the first and second legs, respectively, and the third region is contacted to the metal-one island. Typically, each doping region comprises an N+ doping level. Alternatively, a guard ring encircling the outer edge of the integrated circuit die is also coupled by a punchthru device to the bond pad.

The set of metal-one islands, one set associated with each pad cell, reside in the bond pad channel. Each island in the set is coupled to a separate internal signal conductor within the IC. Each island is separated from the bond pad legs by a gap. Filling in the gap between an island and the associated bond pad legs, couples the internal signal connected to the island to the bond pad. Thus, any internal IC signal can be coupled to the bond pad, simply by filling in the gap between the associated island and the bond pad legs. This can be performed without having to rearrange punchthru devices or reconfigure the bond pad cell. In addition, the multiple punchthru devices associated with the bond pad provide redundant overvoltage protection in a minimal area.

To accommodate multiple power, ground, and signal pins, the same bond pad cell configuration is placed at various positions around the outer edge of the integrated circuit die. Then, as stated above, the desired internal signal is coupled to the bond pad by filling in the gap between the appropriate island and the legs of the bond pad cell with level-one metal. The appropriate island being the one located directly underneath the desired internal signal. Filling in the gap region with level-one metal, bypasses the associated punchthru device by shorting together its respective drain and source regions. An external package pin is connected to the desired bond pad cell via a bonding wire. Thus, applying an external signal to the pin drives the internal IC devices coupled to the contacted metal-two conductor.

The foregoing and other objects, features and advantages of the invention will become more readily apparent from the following detailed description of a preferred embodiment of the invention which proceeds with reference to the accompanying drawings.

DETAILED DESCRIPTION

Figure 1:
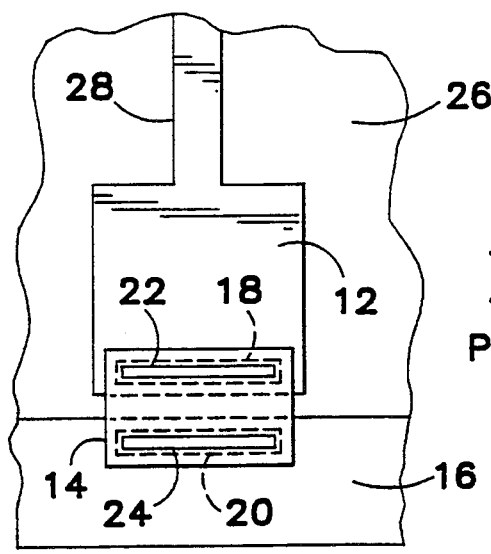
FIG. 1 is a prior art depiction of a bond pad connected to a single punchthru device.

FIG. 1 is a top view of prior art showing part of an integrated circuit die. A bonding pad region (bond pad) 12 is coupled through a punchthru device 14 to a ground ring 16. The punchthru device 14 comprises a first N+ doping region 18 coupled to bond pad 12 by a contact 22. A second N+ doping region 20 is coupled to ground ring 16 by a contact 24. Bond pad 12 is coupled by a wire (not shown) to an external IC pin. The external pin extends out of an IC package and carries an external signal (i.e., VCC, ground, control, or data signals). Conductor 28 extends into the interior of the integrated circuit connecting the signal on bond pad 12 to active and passive components within the IC.

High voltages can inadvertently be applied to the internal components connected to conductor 28. For example, by an ESD event from someone touching the external pin coupled to bond pad 12. The high voltage can either destroy the internal IC components (e.g., bipolar or field effect transistors) or destroy the conductor 28. To prevent component damage, punchthru device 14 shorts the signal on bond pad 12 to ground ring 16, when voltage across the punchthru is above a predetermined voltage level (e.g., 17 volts). The high voltage is then directed away from the IC components and discharged to ground. When the high voltage condition has ended, the punchthru device goes back into a high impedance state. This allows the signal on bond pad 12 to pass over conductor 28 to the internal components within the IC.

Figure 2:
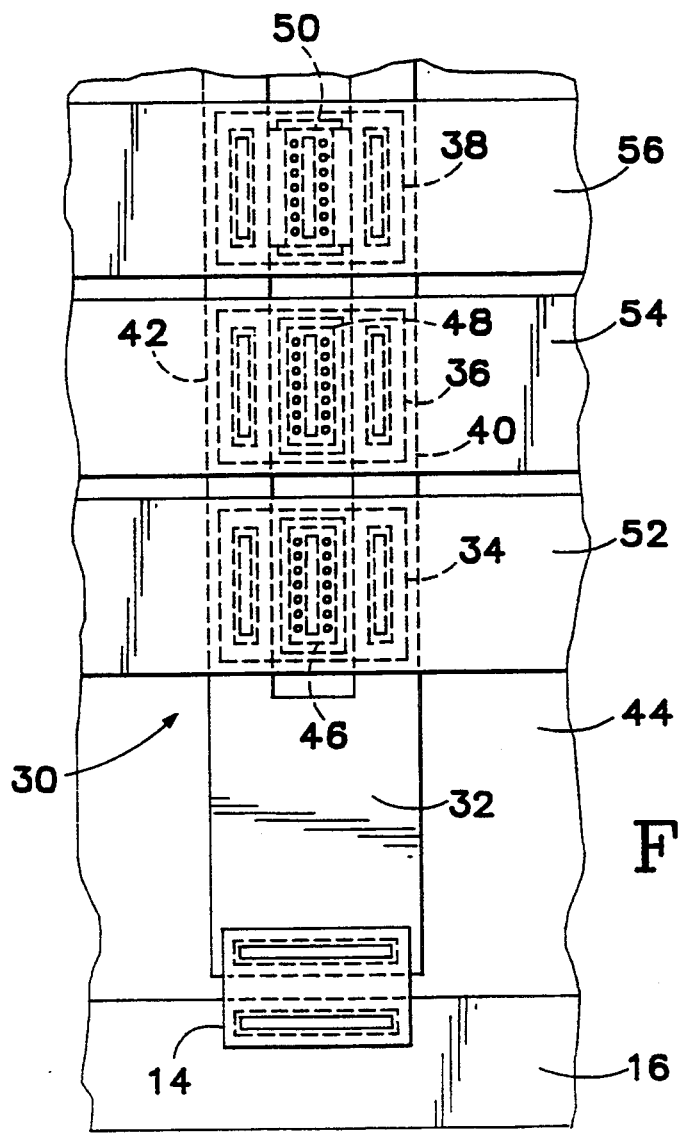
FIG. 2 is a top view of a bond pad cell coupled to redundant back-to-back punchthru devices according to the invention.

FIG. 2 is a top view of a bond pad cell 30 that provides redundant overvoltage protection according to the invention. The bond pad cell 30 comprises a bonding region (bond pad) 32 with two bond pad legs 40 and 42. The bond pad and bond pad legs are fabricated from a first metal level (metal-one). A set of punchthru devices 34, 36, and 38 have associated metal-one islands 46, 48, and 50, respectively. The islands are positioned under conductors 52, 54, and 56, respectively. The conductors are formed from a second metal layer (metal-two) residing above the first layer.

Figure 3:
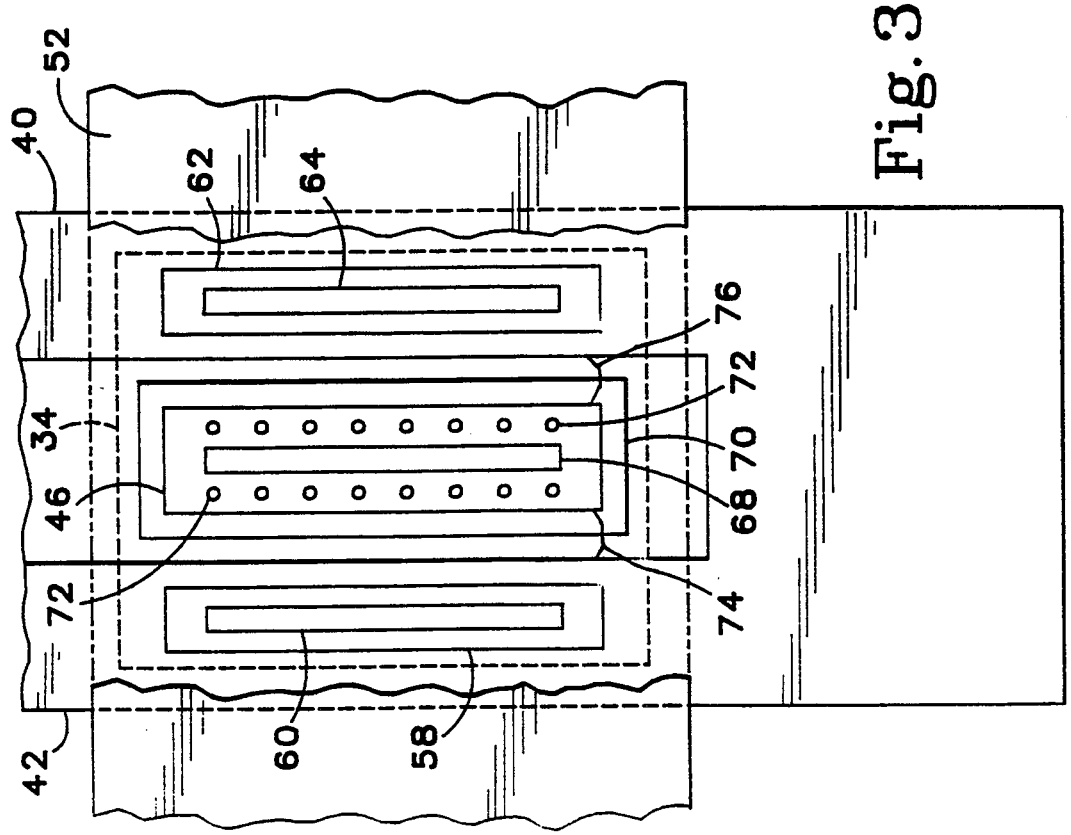
FIG. 3 shows an enlargement of a single back-to-back punchthru device according to the invention as shown in FIG. 2.

FIG. 3 is an enlarged illustration of punchthru 34 from FIG. 2. Metal-two conductor 52 is shown cutaway to better illustrate the punchthru device. A first N+ doping region 58 is coupled to bond pad leg 42 by a contact 60. A second N+ doping region 62 is coupled to bond pad leg 40 by a contact 64. The island 46 is fabricated from the first level metal, and is coupled to a third N+ doping region 70 by a contact 68. The island 46 is further coupled to metal-two conductor 52 by contacts 72. A gap 74 exists between bond pad leg 42 and island 46 and a gap 76 exists between bond pad leg 40 and island 46.

Figure 5:
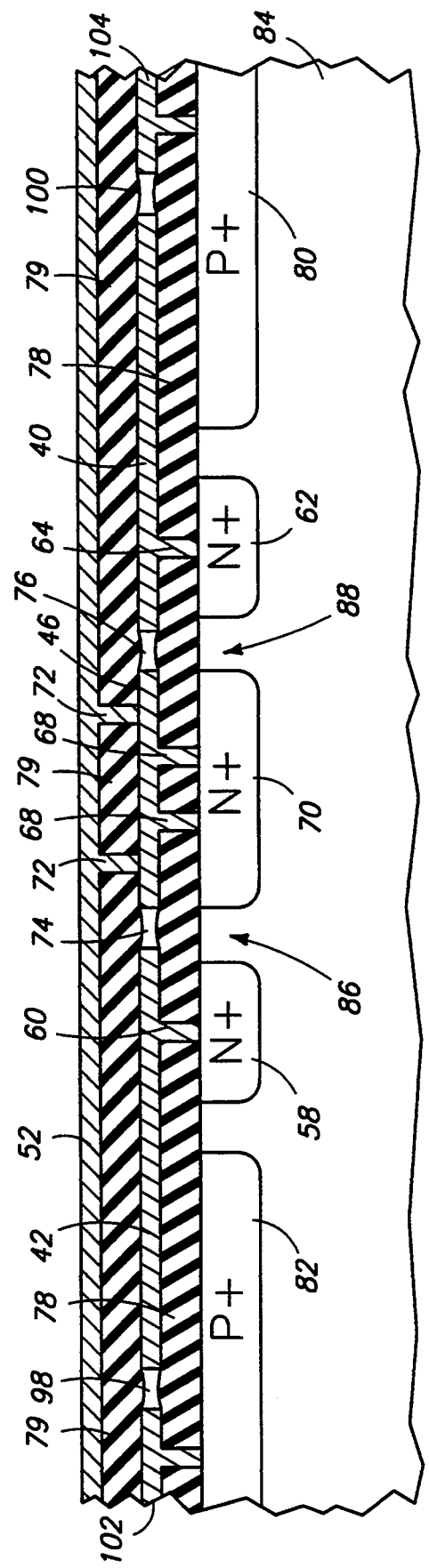
FIG. 5 is a cross-section of a back-to-back punchthru device according to the invention.

FIG. 5 is a cross-section of punchthru device 34 from FIG. 2. A silicon substrate 84 contains the N+ doping regions 58, 70, and 62 as described in FIG. 3. P+ doping regions 80 and 82 isolate the punchthru device from adjacent devices within the IC. Bond pad legs 42 and 40, and island 46 are all fabricated from first level metal. Gaps 74 and 76 separate island 46 from the bond pad legs. A field oxide layer 78 separates the metal-one layer from the surface of silicon substrate 84. Conductor 52 is fabricated from a second metal layer and is separated from metal-one by insulating layer 79.

Contacts 68 couple island 46 to N+ region 70 and contacts 72 couple metal-two conductor 52 to island 46. Contact 60 connects bond pad leg 42 to N+ region 58 and contact 64 connects bond pad leg 40 to N+ region 62. A gap 98 separates bond pad leg 42 from ground conductor 102 and a gap 100 separates bond pad leg 40 from ground conductor 104. A punchthru region 86 comprises the silicon area between N+ region 58 and N+ region 70 and punchthru region 88 comprises the silicon area between N+ region 70 and N+ region 62.

During normal operation, there is insufficient voltage potential across N+ regions 58 and 70 (i.e., bond pad 32 and conductor 52) or across N+ regions 62 and 70 to instigate electrical conduction. Therefore, conductor 52 is normally not conductively coupled to the bond pad cell. However, if a large enough voltage exists between bond pad 32 and conductor 52 (e.g., ESD event), punchthru regions 86 and 88 provide a low resistance electron path. This redirects the high voltage charge from bond pad 32 through conductor 52. Alternatively (depending on the signals coupled to bond pad 32 and conductor 52), a high voltage charge on conductor 52 is redirected to bond pad 32. Typically, conductor 52 is connected to either VCC, DVCC (dirty VCC), GND (ground), or DGND (dirty GND). Dirty VCC and dirty GND are internal VCC and ground signals used to supply power to final transistors in pad drivers. DVCC and GND are isolated from VCC and ground, respectively, to reduce noise effects.

The punchthru device in an active state, prevents a large voltage difference from developing across any device or insulator on the chip, therefore, preventing a high voltage charge from reaching the sensitive internal components of the IC. After the high voltage condition subsides, punchthru regions 86 and 88 revert back to a nonconductive state. This electrically isolates bond pad 32 and conductor 52, allowing each to carry separate signals.

Figure 4:
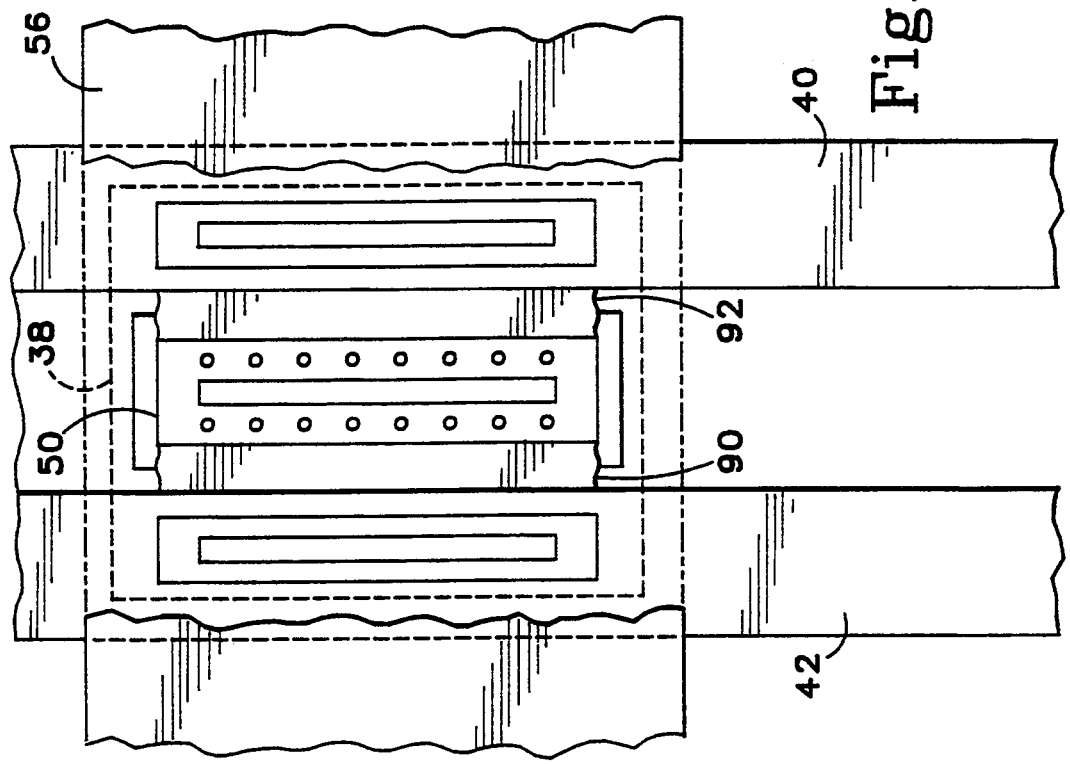
FIG. 4 shows an enlargement of a metal-two conductor coupled to a metal-one bond pad according to the invention as shown in FIG. 2.

To connect bond pad 32 to conductor 52, gap regions 74 and 76 are filled in with level one metal. This couples pad legs 40 and 42, respectively, to island 46. Since island 46 is already coupled to conductor 52 through contacts 72, bond pad 32 is also coupled to conductor 52. The external IC pin coupled to bond pad 32 can then either drive or receive signals to or from conductor 52. FIG. 4 shows conductor 56 from FIG. 2 coupled to bond pad legs 42 and 40. Gap regions separating island 50 from the bond pad legs 42 and 40, are filled in with level one metal 90 and 92, respectively. Therefore, the above method for connecting various metal-two conductors to the metal-one bond pad requires only one set of IC process masks to generate any bond pad cell.

For example, referring back to FIG. 2, conductor 56 is shown coupled to the legs of bond pad 32. The punchthru device 38 while fabricated in an identical manner as punchthru devices 34 and 36, is bypassed by filling in the gaps between island 50 and the bond pad legs 42 and 40. Alternatively, either conductor 54 or 52 can be decoupled to the bond pad by filling in the gaps between their respective islands and the bond pad legs. The gaps in the island/bond pad legs in punchthru device 38 would then remain unfilled. Thus, the same process masks are used to couple any conductor to any given bond pad. Also, to increase over-voltage protection, punchthru device 14 (FIG. 1) can also be coupled between bond pad 32 and ground ring 16.

Figure 6:
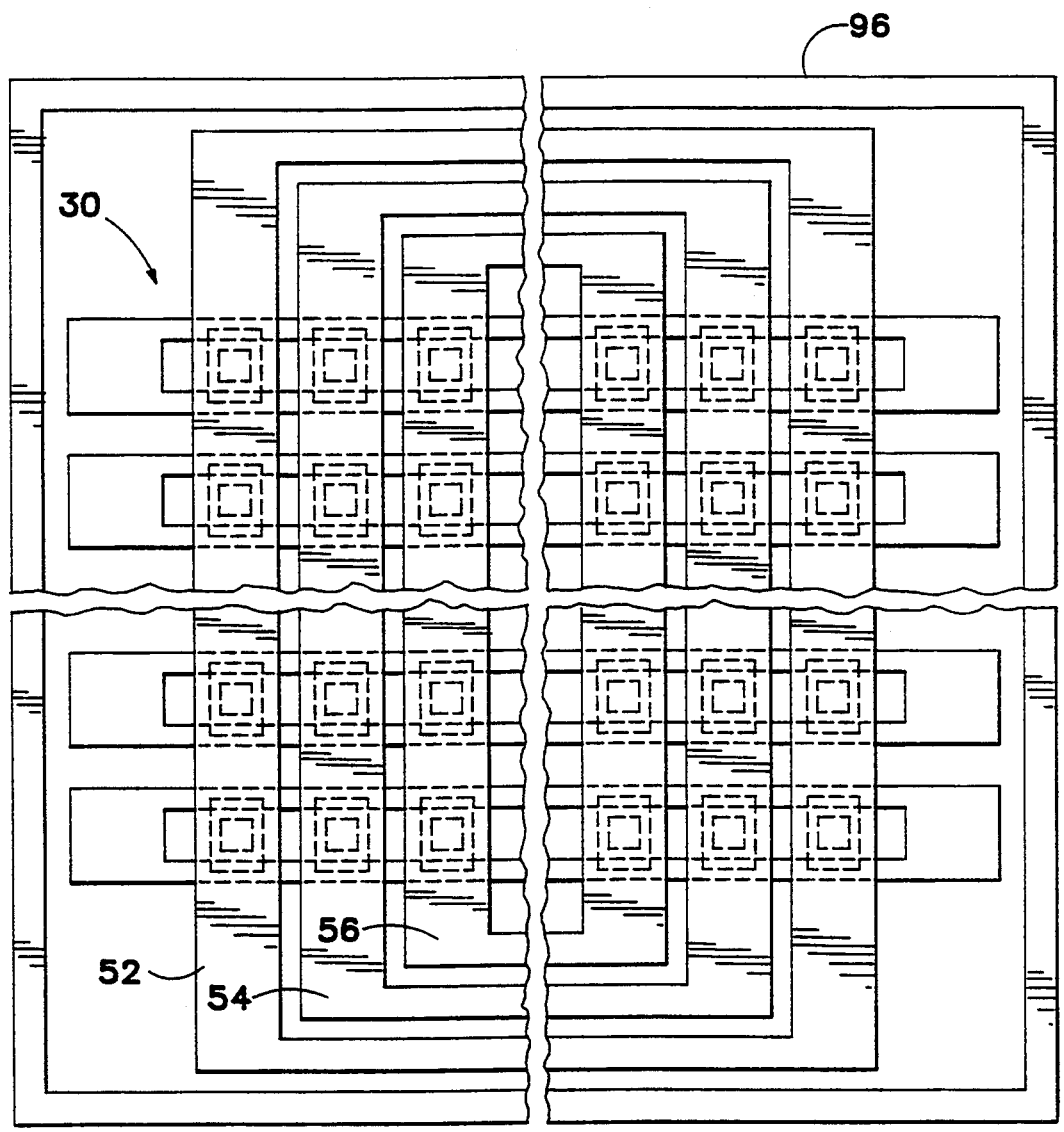
FIG. 6 is a top view of an integrated circuit die showing multiple bond pad cells with redundant back-to-back punchthru devices according to the invention.

FIG. 6 is a top view showing multiple bond pad cells positioned at various locations around an IC die 96. The bond pads are coupled to various metal conductors 52, 54, and 56, residing on the IC. The positioning of the punchthru devices between the bond pad legs allow the bond pad cells to be positioned close together. The back-to-back punchthru device configuration increases the capacity of each device to distribute high currents. Each bond pad cell also increases the overvoltage protection by providing multiple punchthru devices coupled to more than one alternative power or ground conductor. Placing the punchthru devices between the legs of each bond pad with a vertical orientation also reduces the chance of latchup since the punchthru devices of adjacent bond pad cells are spaced further apart. For example, as opposed to punchthru devices positioned horizontally on the outside of the bond pad cell.

Having described and illustrated the principles of the invention in a preferred embodiment thereof, it should be apparent that the invention can be modified in arrangement and detail without departing from such principles. I claim all modifications and variation coming within the spirit and scope of the following claims:

1. An overvoltage protection circuit for protecting an integrated circuit from high voltage damage comprising:
   a substrate of an integrated circuit die, the integrated circuit die having an outer edge;
   a metal-one conductor formed from a first metal level above the substrate and extending across the integrated circuit die in a first direction substantially perpendicular with the outer edge of the integrated circuit die;
   multiple metal-two conductors formed from a second metal level above the substrate and the first metal level for coupling various power, ground and data signals to active and passive devices within the integrated circuit, the metal-two conductors extending across the integrated circuit die in a second direction substantially perpendicular to the first direction and overlapping the metal-one conductor; and
   multiple punchthru devices formed in the substrate, each punchthru device coupled between a different metal-two conductor and the metal-one conductor, each punchthru device coupling its respective metal-two conductor to the metal-one conductor when a predetermined voltage potential exists between said metal-one and metal-two conductors.

2. An overvoltage protection circuit according to claim 1 wherein the metal-one conductor comprises a pad portion and at least one leg elongated in the first direction.

3. An overvoltage protection circuit according to claim 2 wherein the pad portion has an outer periphery; and
   the punchthru devices and the metal-one conductor leg are dimensioned to reside within an area defined by the outer periphery of the pad portion.

4. An overvoltage protection circuit according to claim 1 including multiple metal-one islands formed from the first metal level and elongated in a direction substantially parallel with the metal-one conductor, each metal-one island being coupled to a respective metal-two conductor, but separated from the metal-one conductor by a non-conductive gap.

5. An overvoltage protection circuit according to claim 4 further comprising a conductive fill formed from the first metal level provided in the non-conductive gap between each metal-one island and the metal-one conductor to couple the respective metal-two conductor to the metal-one conductor.

6. An overvoltage protection circuit according to claim 1 wherein each punchthru device is positioned underneath one of the metal-two conductors.

7. An overvoltage protection circuit according to claim 1 including a guard ring circling the outer edge of the integrated circuit die, one of said punchthru devices coupled between the guard ring and the metal-one conductor.

8. An overvoltage protection circuit according to claim 1 wherein each punchthru device comprises two doping regions provided in the substrate, one doping region being coupled to at least one of the metal-two conductors and the other doping region being coupled to the metal-one conductor.

9. An overvoltage protection circuit according to claim 1 wherein at least one of the metal-two conductors is coupled to the metal-one conductor.

10. A high voltage protection device for an integrated circuit comprising:
a substrate of an integrated circuit die, the integrated circuit die having an outer edge;
multiple metal-one conductors fabricated from a first metal level that is applied over the substrate, each metal-one conductor having a bond pad connected to first and second parallel legs, the legs being separated by a channel and extending across the integrated circuit die in a first direction that is substantially perpendicular with the outer edge of the integrated circuit die;
multiple metal-two conductors fabricated from a second metal level that is applied over the substrate and the first metal level, individual metal-two conductors extending across the integrated circuit die in a second direction that is substantially perpendicular to the first direction; and
multiple back-to-back punchthru devices formed in the substrate and elongated in a direction substantially parallel with the first and second legs, the punchthru devices being positioned under associated metal-two conductors, each punchthru device being coupled between an associated metal-two conductor and an associated metal-one conductor, the punchthru device coupling the associated metal-two conductor to the associated metal-one conductor when a voltage between said associated conductors is above a predetermined voltage level.

11. An integrated circuit according to claim 10 including multiple sets of metal-one islands fabricated from the first metal level, each set of metal-one islands residing in a different leg channel and each metal-one island in a set coupled to a separate metal-two conductor.

12. An integrated circuit according to claim 10 wherein the bond pad of each metal one conductor has a width; and
the first and second legs of each metal-one conductor have respective outer edges that are spaced apart by a distance which is approximately equal to or less than the width of an associated bond pad.

13. An integrated circuit according to claim 10 wherein each punchthru device comprises a substrate having first, second, and third doping regions, the first- and second doping regions coupled to the first and second legs of a metal-one conductor respectively, and the third doping region coupled to one of the metal-one islands within the metal-one conductor channel.

14. An integrated circuit according to claim 13 wherein each doping region comprises an N+ dopant.

15. An integrated circuit according to claim 10 wherein the metal-one conductors are placed at different locations around the outer edge of the integrated circuit die, each metal-one conductor having the same layout.

16. A back-to-back punchthru device for protecting an integrated circuit from overvoltage damage comprising:
a silicon substrate for fabricating integrated circuits;
first, second, and third dopant regions diffused in the substrate, the second dopant region residing between the first and third dopant regions, areas of the silicon substrate between the first and second dopant regions and between the second and third dopant regions defining back-to-back punchthru regions;
a first metal conductor connected to the first and third dopant regions, the first metal conductor being formed of a first metal level that is applied over the silicon substrate;
a second metal conductor connected to the second dopant region, the second metal conductor being formed of a second metal level that is applied over the silicon substrate and the first metal level, the second metal conductor overlapping the back-to-back punchthru regions and the first metal conductor; and
the first and third dopant regions being simultaneously coupled to the second dopant region to electrically connect the first and second metal conductors when a voltage across the back-to-back punchthru regions is above a predetermined voltage level.

17. A back-to-back punchthru device according to claim 16 further comprising:
an island formed from the first metal level adjacent to, but separated from, the first conductor by a non-conductive gap, the island being coupled to the second conductor.

18. A back-to-back punchthru device according to claim 16 further comprising:
an island formed from the first metal level adjacent to, but separated from, the first conductor by a non-conductive gap, the island being coupled to the second conductor; and
a conductive fill formed from the first metal level provided in the non-conductive gap to couple the first conductor to the second conductor.

* * * * *